(12) United States Patent
Bhatti et al.

(10) Patent No.: US 7,506,682 B2
(45) Date of Patent: Mar. 24, 2009

(54) LIQUID COOLED THERMOSIPHON FOR ELECTRONIC COMPONENTS

(75) Inventors: Mohinder Singh Bhatti, Amherst, NY (US); Debashis Ghosh, Amherst, NY (US); Ilya Reyzin, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 609 days.

(21) Appl. No.: 11/040,989

(22) Filed: Jan. 21, 2005

(65) Prior Publication Data

US 2006/0162904 A1     Jul. 27, 2006

(51) Int. Cl.
F28D 15/00     (2006.01)
F28F 7/00      (2006.01)
H05K 7/20      (2006.01)

(52) U.S. Cl. ............ 165/104.14; 165/80.4; 165/104.33
(58) Field of Classification Search ............ 165/104.14, 165/104.21, 104.33, 104.34, 80.4; 361/699, 361/700; 257/714, 715
See application file for complete search history.

(56) References Cited

U.S. PATENT DOCUMENTS

| | | | |
|---|---|---|---|
| 2,083,611 A | 6/1937 | Marshall | |
| 3,415,315 A | 12/1968 | Donaldson et al. | |
| 3,511,310 A | 5/1970 | Van Loo | |
| 3,512,582 A * | 5/1970 | Chu et al. ............... | 165/104.27 |
| 3,800,868 A * | 4/1974 | Berkowitz et al. .......... | 165/170 |
| 3,817,321 A * | 6/1974 | Von Cube et al. ...... | 165/104.22 |
| 3,906,261 A | 9/1975 | Ogura et al. | |
| 4,020,399 A | 4/1977 | Suzuki et al. | |
| 4,138,692 A | 2/1979 | Meeker et al. | |
| 4,173,996 A | 11/1979 | Pierce | |
| 4,246,597 A | 1/1981 | Cole et al. | |
| 4,260,014 A | 4/1981 | Feehan | |
| 4,381,032 A * | 4/1983 | Cutchaw ....................... | 165/46 |
| 4,620,900 A | 11/1986 | Kimura et al. | |
| 4,704,658 A | 11/1987 | Yokouchi ..................... | 361/385 |
| 4,884,630 A * | 12/1989 | Nelson et al. ............... | 165/170 |
| 5,150,274 A | 9/1992 | Okada et al. | |
| 5,168,921 A | 12/1992 | Meyer, IV | |
| 5,198,889 A | 3/1993 | Hisano et al. | |
| 5,304,846 A | 4/1994 | Azar .......................... | 257/722 |
| 5,529,115 A | 6/1996 | Paterson ................. | 165/104.33 |
| 5,704,416 A * | 1/1998 | Larson et al. .......... | 165/104.33 |
| 6,062,302 A | 5/2000 | Davis et al. | |
| 6,410,982 B1 | 6/2002 | Brownell et al. | |
| 6,422,307 B1 | 7/2002 | Bhatti ........................ | 165/185 |
| 6,588,498 B1 | 7/2003 | Reyzin et al. .......... | 165/104.33 |
| 6,808,015 B2 * | 10/2004 | Osakabe ................ | 165/104.25 |
| 2003/0034148 A1 | 2/2003 | Oyamada | |
| 2004/0163798 A1 | 8/2004 | Ghosh et al. ............ | 165/104.21 |

OTHER PUBLICATIONS

EP 06 07 5006, European Search Report dated Apr. 12, 12006.

* cited by examiner

*Primary Examiner*—Tho V Duong
(74) *Attorney, Agent, or Firm*—Patrick M Griffin

(57) ABSTRACT

A fluid heat exchanger assembly cools an electronic device with a cooling fluid supplied from a heat extractor (R, F) to an upper portion of a housing. A refrigerant is disposed in a lower portion of the housing for liquid-to-vapor transformation. A partition divides the upper portion of the housing from the lower portion and flow interrupters are disposed in the upper portion for interrupting thermal boundary layer to enhance thermal heat transfer to the flow of liquid coolant through the coolant passage of the upper portion in response to heat transferred by an electronic device to the lower portion of the housing.

7 Claims, 4 Drawing Sheets

LIQUID COOLED THERMOSIPHON FOR ELECTRONIC COMPONENTS

RELATED APPLICATIONS

The subject invention is related to the inventions disclosed in co-pending application Ser. Nos. 11/040,321 and 11/040,988, filed concurrently herewith.

BACKGROUND OF THE INVENTION

1. Field of the Invention

A fluid heat exchanger assembly for cooling an electronic device.

2. Description of the Prior Art

Research activities have focused on developing assemblies to efficiently dissipate heat from electronic devices that are highly concentrated heat sources, such as microprocessors and computer chips. These electronic devices typically have power densities in the range of about 5 to 35 $W/cm^2$ and relatively small available space for placement of fans, heat exchangers, heat sink assemblies and the like. However, these electronic devices are increasingly being miniaturized and designed to achieve increased computing speeds that generate heat up to 200 $W/cm^2$.

Heat exchangers and heat sink assemblies have been used that apply natural or forced convection cooling methods to cool the electronic devices. These heat exchangers typically use air to directly remove heat from the electronic devices. However, air has a relatively low heat capacity. Such heat sink assemblies are suitable for removing heat from relatively low power heat sources with power density in the range of 5 to 15 $W/cm^2$. The increased computing speeds result in corresponding increases in the power density of the electronic devices in the order of 20 to 35 $W/cm^2$ thus requiring more effective heat sink assemblies.

In response to the increased heat to be dissipated, liquid-cooled units called LCUs employing a cold plate in conjunction with high heat capacity fluids, like water and water-glycol solutions, have been used to remove heat from these types of high power density heat sources. One type of LCU circulates the cooling liquid so that the liquid removes heat from the heat source, like a computer chip, affixed to the cold plate, and is then transferred to a remote location where the heat is easily dissipated into a flowing air stream with the use of a liquid-to-air heat exchanger and an air moving device such as a fan or a blower. These types of LCUs are characterized as indirect cooling units since they remove heat from the heat source indirectly by a secondary working fluid, generally a single-phase liquid, which first removes heat from the heat source and then dissipates it into the air stream flowing through the remotely located liquid-to-air heat exchanger. Such LCUs are satisfactory for moderate heat flux less than 35 to 45 $W/cm^2$ at the cold plate.

In the prior art heat sinks, such as those disclosed in U.S. Pat. Nos. 6,422,307 and 5,304,846, the single-phase working fluid of the liquid cooled unit (LCU) flows directly over the cold plate causing cold plate corrosion and leakage problems.

As computing speeds continue to increase even more dramatically, the corresponding power densities of the devices rise up to 200 $W/cm^2$. The constraints of the miniaturization coupled with high heat flux generated by such devices call for extremely efficient, compact, and reliable thermosiphon cooling units called TCUs. Such TCUs perform better than LCUs above 45 $W/cm^2$ heat flux at the cold plate. A typical TCU absorbs heat generated by the electronic device by vaporizing the captive working fluid on a boiler plate of the unit. The boiling of the working fluid constitutes a phase change from liquid-to-vapor state and as such the working fluid of the TCU is considered to be a two-phase fluid. The vapor generated during boiling of the working fluid is then transferred to an air-cooled condenser, in close proximity to the boiler plate, where it is liquefied by the process of film condensation over the condensing surface of the TCU. The heat is rejected into an air stream flowing over a finned external surface of the condenser. The condensed liquid is returned back to the boiler plate by gravity to continue the boiling-condensing cycle. These TCUs require boiling and condensing processes to occur in close proximity to each other thereby imposing conflicting thermal conditions in a relatively small volume.

Examples of cooling systems for electronic devices are disclosed in U.S. Pat. No. 4,704,658 to Yokouchi et al; U.S. Pat. No. 5,529,115 to Paterson and U.S. Pat. No. 5,704,416 to Larson et al.

SUMMARY OF THE INVENTION AND ADVANTAGES

In accordance with the subject invention, heat generated by an electronic device is transferred to the lower portion of a housing having a refrigerant therein for liquid-to-vapor transformation as liquid coolant flows above a partition defining a coolant passage in the upper portion of the housing. Flow interrupters are disposed in the coolant passage for interrupting thermal boundary layer to enhance thermal heat transfer to the liquid coolant flowing through the coolant passage of the coolant passage in the upper portion in response to heat transferred by an electronic device to the lower portion of the housing.

The invention employs a partition to separate the secondary two-phase fluid from the single-phase working fluid of the TCU with flow interrupters in the coolant passage to augment the heat transfer coefficient.

The present invention utilizes a captive secondary fluid capable of undergoing liquid-to-vapor transformation within the boiling chamber to remove heat by ebullition from the cold plate. The resulting vapor fills the lower portion or boiling chamber under the partition, which separates the working fluid of the upper portion from the secondary fluid vapor in the lower portion or boiling chamber. The secondary fluid vapor is condensed by the working fluid flowing over the partition surface. Thus, the lower portion or boiling chamber with the secondary two-phase fluid functions as a thermosiphon with superincumbent cooling chamber defined by the partition serving as the condenser partition. Unlike the air cooled condensers of the prior art, the liquid cooled condenser of the subject invention is more effective in condensing the refrigerant vapor due to the higher heat capacity of the liquid coolant.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENT

Figure 3:
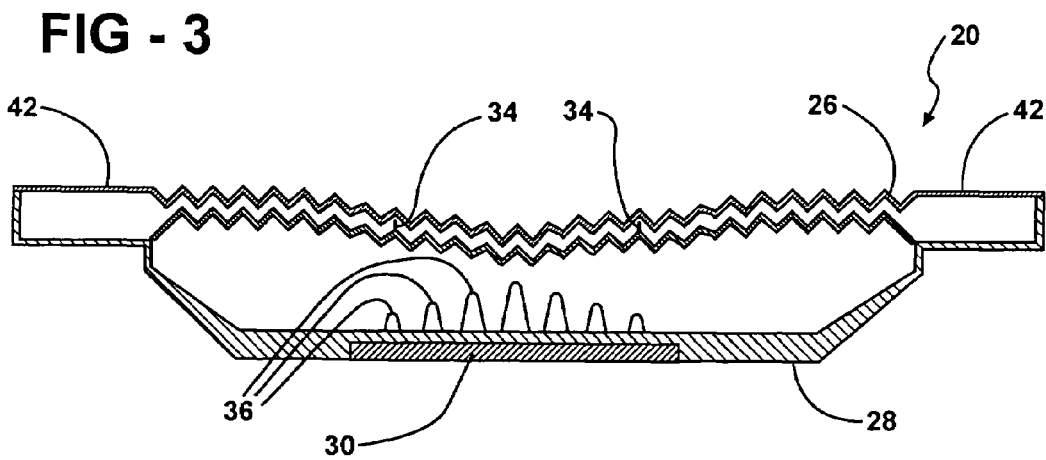
FIG. 3 is a second embodiment of the invention.
Figure 4:
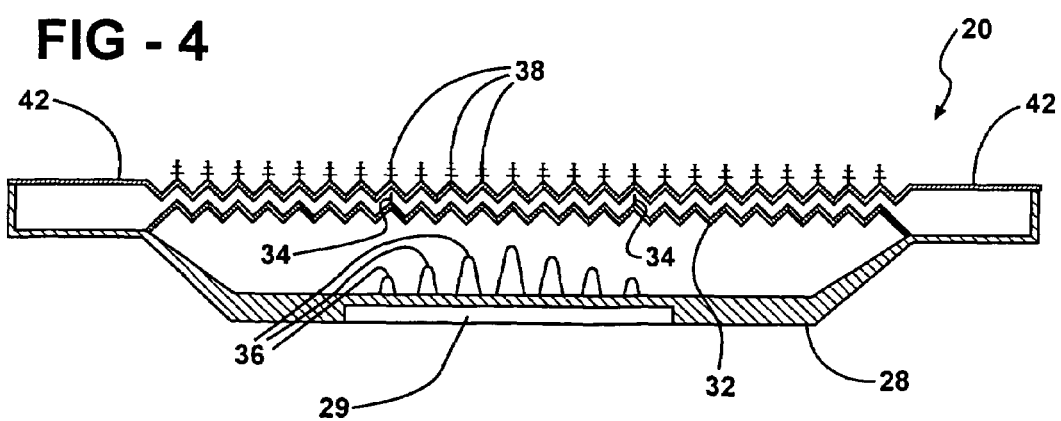
FIG. 4 is a third embodiment.
Figure 5:
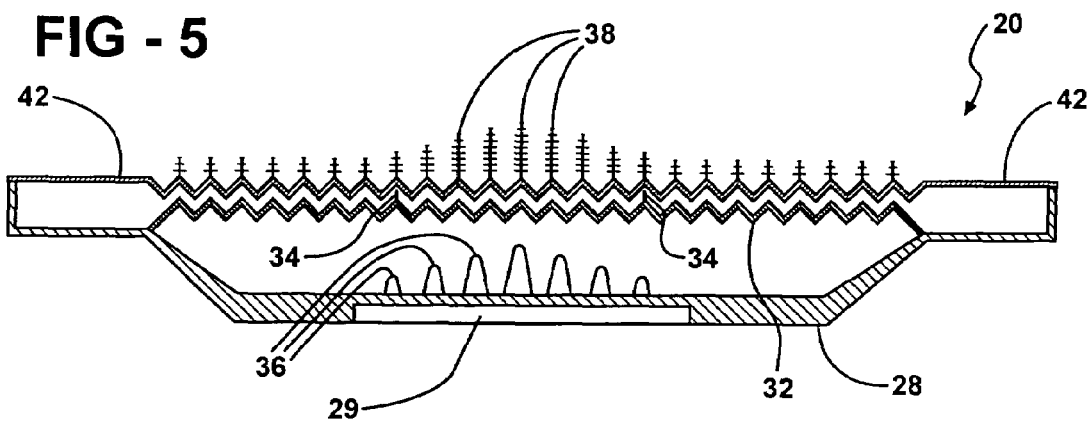
FIG. 5 is a fourth embodiment.

A fluid heat exchanger assembly comprises a housing 20 having an inlet 22 and an outlet 24 and an upper portion 26 defining a top or upper wall 27 and a lower portion 28 extending between the inlet 22 and the outlet 24 for establishing a direction of flow from the inlet 22 to the outlet 24. The assembly is used to cool an electronic device 30 engaging or secured to the lower portion 28 of the housing 20. As shown in FIG. 3, the electronic device 30 or component is preferably adhesively secured in a recess 29 in the bottom of the housing 20.

A partition 32 divides the housing 20 into the upper portion 26 and the lower portion 28 for establishing a direction of flow of liquid coolant in a coolant passage 33 defined between the upper wall 27 and the partition 32 from the inlet 22 to the outlet 24 in the upper portion 26. The housing 20 is hermetically sealed about the partition 32 to contain a refrigerant in the lower portion 28 for liquid-to-vapor transformation. In other words, the partition 32 separates the refrigerant in the lower portion 28 from the liquid coolant in the coolant passage 33 of the upper portion 26.

Figure 1:
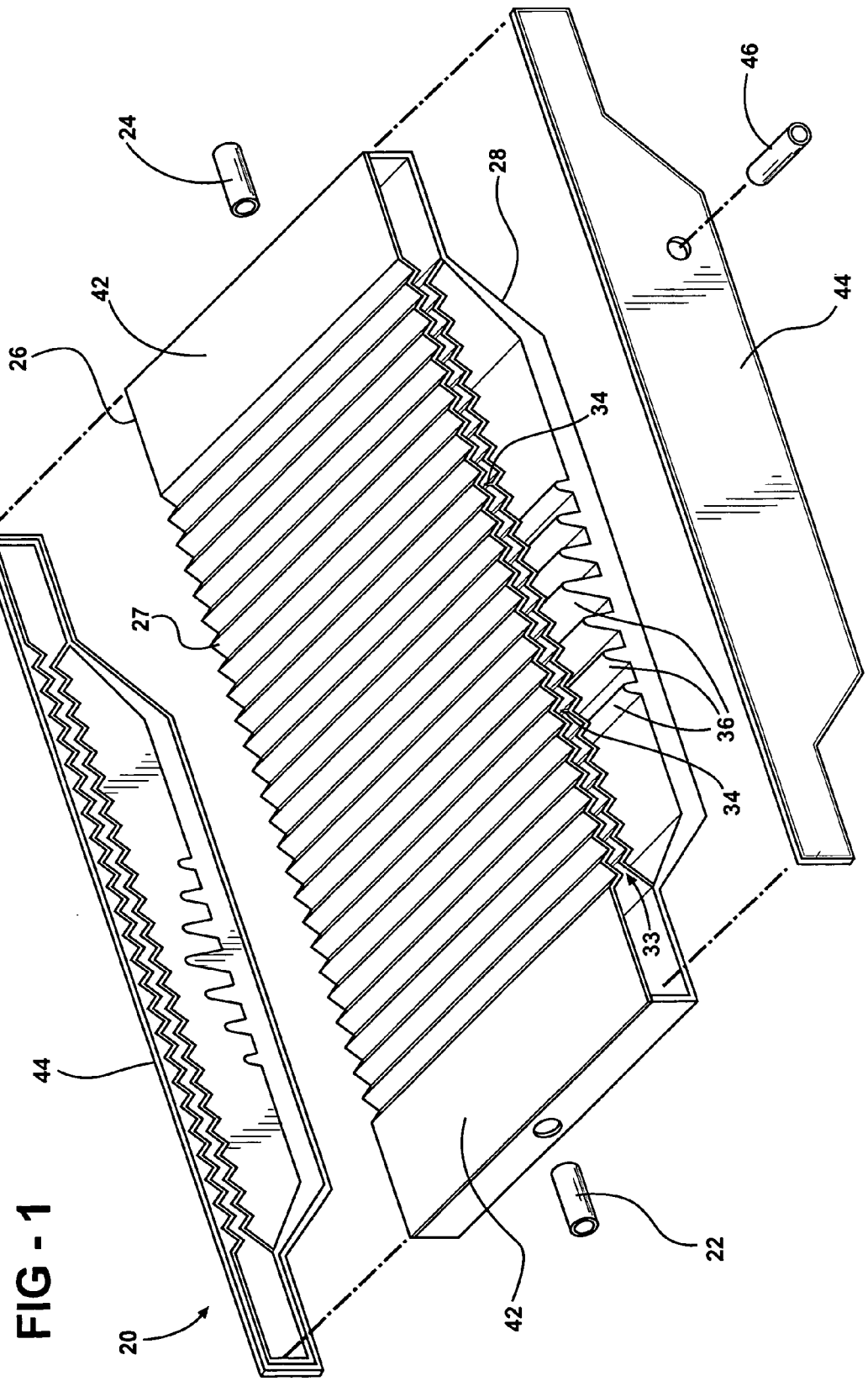
FIG. 1 is an exploded perspective view of the heat exchanger of the subject invention.
Figure 2:
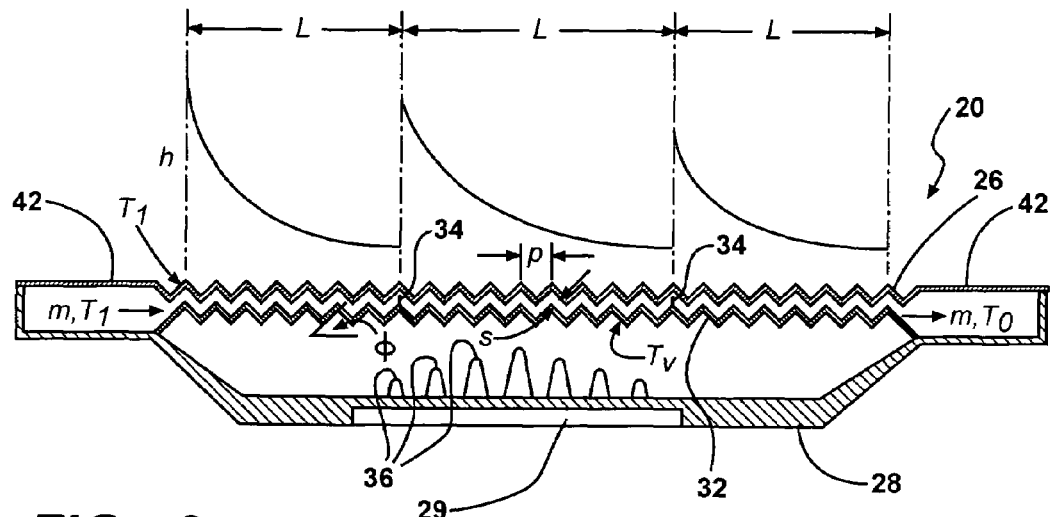
FIG. 2 is a cross sectional view of the heat exchanger shown in FIG. 1.

The partition 32 and the upper wall 27 are undulated or corrugated transversely to the direction of flow from the inlet 22 to the outlet 24 to define the flow passage 33. The partition 32 defines a bottom of the coolant passage 33 in the upper portion 26 and the upper wall 27 of the upper portion 26 defines a top of the coolant passage 33, which top or upper wall 27 is also undulated transversely to the direction of flow from the inlet 22 to the outlet 24 to define the coolant passage 33. Disposed inside the coolant passage 33 are the flow interrupters 34 extending vertically upward into the coolant stream. The purpose of the flow interrupters 34 is to interrupt the thermal boundary layer growing from the upper corrugated wall 27 and the lower corrugated wall 32 of the coolant passage 33. The interruption of the thermal boundary layer causes the heat transfer coefficient h to attain higher value at the point of interruption as indicated in FIG. 2, which shows two flow interrupters each located distance L apart. As the thermal boundary layer grows the heat transfer coefficient h decreases. If the flow interrupters 34 are not provided the heat transfer coefficient attains extremely low value undermining the thermal performance of the thermosiphon 20.

Figure 6:
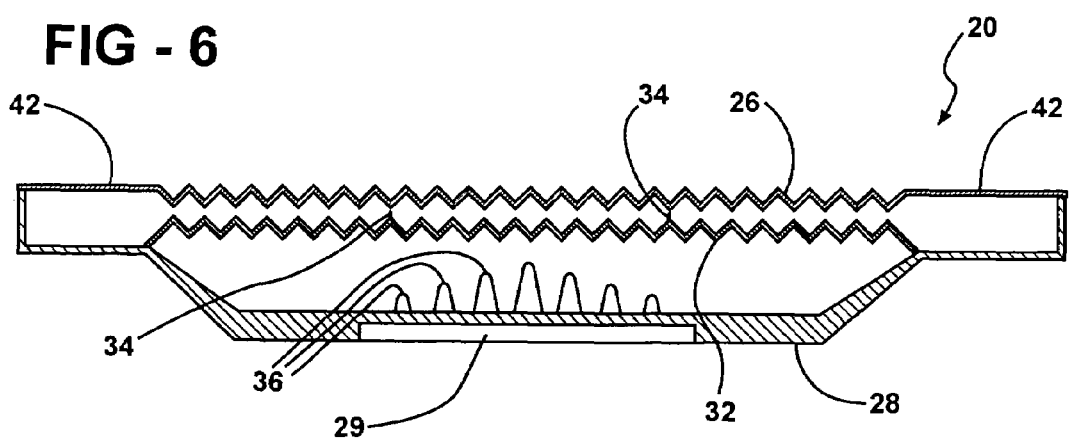
FIG. 6 is a fifth embodiment.
Figure 7:
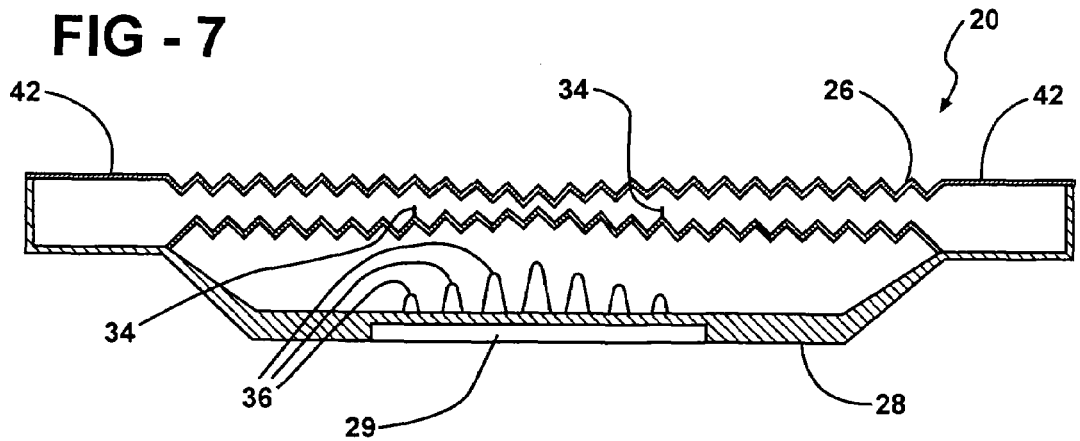
FIG. 7 is a sixth embodiment.

In the embodiments of FIGS. 1-5, the V-shaped crests defining the top (upper wall 27) and the bottom (partition 32) of the coolant passage 33 are vertically aligned to parallel one another so that the coolant passage 33 has a constant gap or cross sectional area therealong, i.e., the vertical dimension between the top and bottom of the upper portion 26 remains constant between the inlet 22 to the outlet 24. On the other hand, in the embodiment of FIG. 6 the V-shaped crests defining the top and the bottom of the coolant passage 33 are vertically offset so that the coolant passage 33 has a variable gap or cross sectional area therealong. In the embodiment of FIG. 7, the top and bottom V-shaped crests may be either but are spaced vertically farther apart adjacent the inlet 22 and the outlet 24 than between the inlet 22 and the outlet 24 for narrowing the volume of the coolant passage 33 between the inlet 22 and the outlet 24. The advantage of a coolant passage 33 having a variable gap between the undulations is that it provides additional heat transfer enhancement because of the periodic expansion and contraction of the liquid coolant flow. In the embodiment of FIG. 3, the top and the bottom sag into the lower portion 28 between the inlet 22 and the outlet 24 so that the coolant passage 33 is closer to the electronic device 30 between the ends thereof. Said another way, the partition 32 sags into the lower portion 28 so that the coolant passage 33 is closer to the electronic device 30 between the inlet 22 and the outlet 24. The undulated partition 32 and the undulated upper wall 27 define V-shaped crests and the flow interrupters (34) extend from the apex of the V-shaped crests spaced apart a distance L.

A plurality of fins 36 extend from the bottom of the housing 20 for increasing heat transfer from the electronic device 30 to the interior of the lower portion 28 of the housing 20. The fins 36 extend linearly across the direction of flow under the partition 32 and between the inlet 22 and the outlet 24 in the upper portion 26. The heat transfer fins 36 are disposed in the lower portion 28 of the housing 20 for transferring heat from the electronic device 30 disposed on the exterior of the lower portion 28 of the housing 20. The fins 36 vary in height and, more specifically, the fins 36 are of the greatest height midway between the inlet 22 and the outlet 24 and are of progressively lesser height from the midpoint toward the inlet 22 and the outlet 24 respectively. The middle fin 36 may extend all the way to the lower corrugated wall 32 and be brazed to it to provide reinforcement to the vapor chamber below the lower corrugated wall 32. The embodiment of FIG. 3 illustrates that the partition 32 may sag into the lower portion 28 toward the fins 36. The fins 36 may take the form of those disclosed in U.S. Pat. No. 6,588,498.

In addition, heat transfer surfaces 38 may extend upwardly from the upper portion 26 for enhancing heat transfer between the liquid coolant and the environment surrounding the upper portion 26.

The upper portion 26 of the housing 20 is generally rectangular and the lower portion 28 of the housing 20 is generally rectangular and generally coextensive with the upper portion 26. A recess 29 extends into the lower portion 28 of the housing 20 for receiving the electronic device 30. The entire housing 20, including the flow passage 33 with upper corrugated wall 27 and lower corrugated wall 32 along with end sections defining tanks 42, and the pan-shaped lower portion 28 having integrally formed therewith the fins 36 and the recess 29 for the electronic device 30, may be extruded as a single or integral piece thereby obviating the need for various brazing operations. Sections of the extrusion are cut and end plates 44 with braze coating are stamped out of sheet stock. During the stamping of the end plates 44, various grooves are formed in the end plates 44 to receive and facilitate bonding to the edges of the extruded sections, thereby hermetically sealing the upper portion 26 and lower portions 28 of the housing 20. A simple machining operation is used to drill holes in one end plate 44 and in the tanks 42 of the coolant passage 33. After welding a refrigerant charge tube 46 to the hole drilled in the end plate 44, and welding the inlet 22 and outlet 24 to the tanks 42, the entire assembly is wired together for a brazing operation in a furnace. After the brazing operation, the assembly is ready for inspection, testing, charging and connection to a cooling system, as illustrated in FIG. 8.

Figure 8:
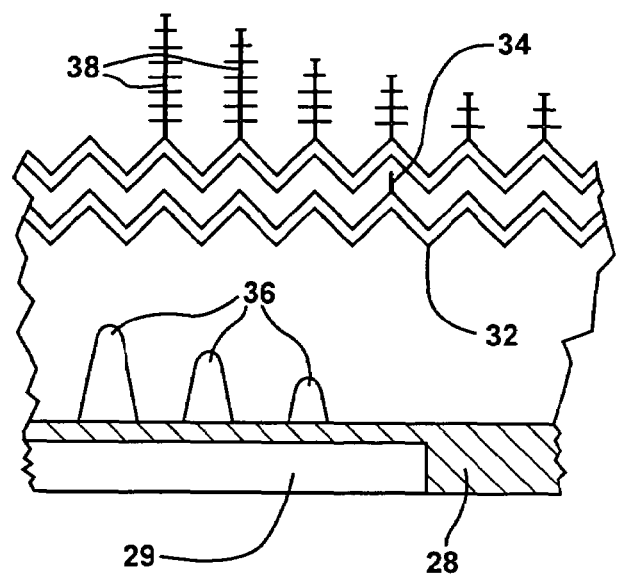
FIG. 8 is a fragmentary enlarged view of FIG. 5 to clearly show the position of the flow interrupter at the apex of an undulation.
Figure 9:
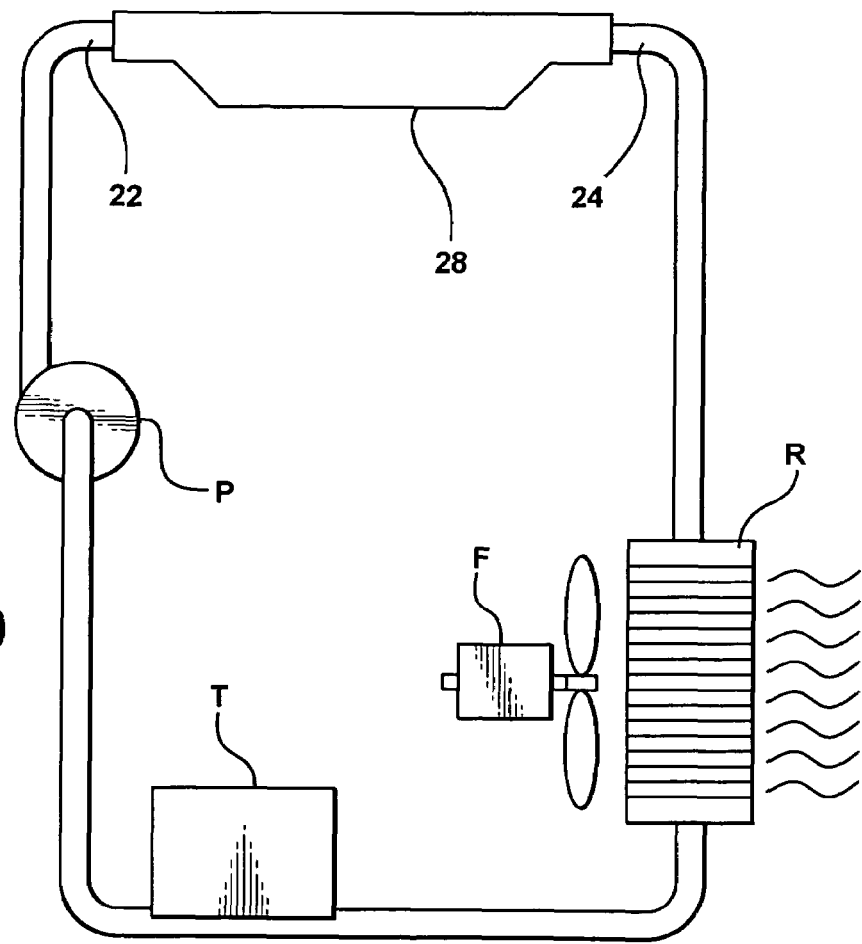
FIG. 9 is a schematic of a liquid cooling system in which the heat exchanger of the subject invention may be utilized.

The liquid cooling system illustrated in FIG. 8 incorporates the heat exchanger housing 20 for cooling an electronic device 30. The electronic device 30 generates an amount of heat to be dissipated and the heat is transferred from the electronic device 30 to the bottom of the heat exchanger housing 20. The heat is then conducted from the bottom to the fins 36 and thence to the refrigerant. A working fluid mover, such as a pump P, moves a cooling fluid, usually a liquid, through a cooling fluid storage vessel T, that stores excess cooling fluid. The pump P moves the cooling fluid through a heat extractor or radiator assembly to dissipate heat from the cooling fluid, the heat extractor or radiator assembly including a fan F and radiator R. The radiator R can be of the well known type including tubes with cooling sheets between the tubes to exchange heat between the cooling fluid passing through the tubes and air forced through the radiator by the fan F. The electronic device 30 generates heat that is transferred through the fins 36 to the captive refrigerant sealed in the lower portion 28 of the housing 20 to boil and vaporize the refrigerant. The vaporized refrigerant rises in the lower portion 28 of the housing 20 and into the V-shaped cavities between the crests of the coolant flow passage 33. The liquid coolant flowing through the undulating coolant passage 33 absorbs heat from the refrigerant vapor thereby condensing the vapor back into liquid refrigerant pooled in the lower portion 28 where it again absorbs heat from the electronic device 30 to repeat the cycle.

As illustrated in FIG. 2, the parameters of the coolant passage 33 are very important. In accordance with the subject invention, the optimum value of the passage gap s is established to be given by the following relation in terms of the transport properties of the coolant as embodied in the dimensionless Prandtl number Pr, the mass flow rate $\dot{m}$ and the dynamic viscosity $\mu$ of the coolant:

$$s = 5.2743 \times 10^{-6} \left[\frac{\Pr}{(1+\Pr^{4/5})^{5/6}}\right]^{8/7} \left(\frac{\dot{m}}{\mu}\right) \quad (1)$$

where the dimensionless Prandtl number is defined as $$\Pr = \frac{\mu c_p}{k} \quad (2)$$

where $\mu$ is the dynamic viscosity of the coolant, $c_p$ is the isobaric specific heat of the coolant and k is the thermal conductivity of the coolant.

Knowing the flow passage gap s from Equation (1), the corrugation pitch p and the flow interrupter height a, shown in FIG. 2 are determined using the following relations:

$$p = 2s \sin \phi \quad (3)$$

$$a \leq s \cos \phi \quad (4)$$

where $\phi$ is the corrugation angle shown in FIG. 2.

According to the subject invention, the flow interruption length L, shown in FIG. 2, is given by the relation $$L \leq 0.032 \dot{m} \left(\frac{c_p}{k}\right)\left(\frac{s \cos\phi}{w}\right) \quad (5)$$

where w is the depth of the thermosiphon perpendicular to the plane of the paper and the remaining symbols are previously defined.

By way of an example we calculate the dimensions of the thermosiphon 20 with a corrugation angle $\phi = 30°$ and depth w=50 mm using the foregoing relations. Let the coolant be water flowing through the flow passage 33 at the rate $\dot{m}=30$ gm/sec at 40° C. At this temperature the transport properties of liquid water are $\mu=6.7918 \times 10^{-3}$ gm/cm·sec, $c_p=0.999$ cal/gm·° C., $k=1.4963 \times 10^{-3}$ cal/cm·sec·° C. and Pr=4.53. Introducing the aforementioned values of $\dot{m}=30$ gm/sec, $\mu=6.7918 \times 10^{-3}$ gm/cm·sec and Pr=4.53 into Equation (1), we obtain the passage gap s=0.31 mm. Next, introducing the calculated value of s=0.31 mm together with the given value of the corrugation angle $\phi=30°$ into Equations (2) and (3), we obtain the corrugation pitch p=0.31 mm and the flow interrupter 34 height $a \leq 0.27$ mm. Finally, introducing the calculated value of s=0.31 mm together with the aforementioned values of $\phi=30°$, w=50 mm, Pr=4.53, $\dot{m}=30$ gm/sec and $\mu=6.7918 \times 10^{-3}$ gm/cm·sec into Equation (5), we obtain the flow interruption length $L \leq 43$ mm.

Based on extensive investigation of the cooling of electronics, it is established that the most useful ranges of s, $\phi$ and L are given by the following relations:

$0.1 \text{ mm} \leq s \leq 2.5 \text{ mm}$ $5° \leq \phi \leq 60°$ $L \leq 50 \text{ mm}$ Consistent with these ranges of s and $\phi$, the useful ranges of p and a can be calculated using Equations (3) and (4).

The flow interrupters 34 interrupt the growth of the thermal boundary layer on the undulated top and bottom walls of the upper portion 26. If the thermal boundary layer is allowed to grow uninterrupted, the resistance to heat transfer progressively increases and results in progressively smaller values of the heat transfer coefficient h as indicated in FIG. 2. By interrupting the thermal boundary layer growth, the thermal boundary layer is forced to restart at the point of interruption with lower thermal resistance and consequently a higher heat transfer coefficient. Accordingly, the flow interrupters 34 give rise to a saw-tooth wave variation of the heat transfer coefficient instead of a monotonically decreasing heat transfer coefficient along the flow passage as indicated in FIG. 2.

The invention therefore provides a method of cooling an electronic device 30 by disposing a refrigerant in the lower portion 28 of the housing 20 for liquid-to-vapor transformation and transferring the heat generated by the electronic device 30 to the lower portion 28 of a housing 20. The method is distinguished by flowing liquid coolant over the flow interrupters 34 disposed in the coolant flow passage 33 for interrupting thermal boundary layer to enhance heat transfer to the flow of liquid coolant through the upper portion 26 in response to heat transferred by an electronic device 30 to the lower portion 28 of the housing 20.

Obviously, many modifications and variations of the present invention are possible in light of the above teachings. The invention may be practiced otherwise than as specifically described within the scope of the appended claims, wherein recitations should be interpreted to cover any combination in which the incentive novelty exercises its utility.

What is claimed is:

1. A fluid heat exchanger assembly for cooling an electronic device with a liquid coolant supplied from a heat extractor (R, F) and comprising;

a housing having an inlet and an outlet and an upper portion and a lower portion with said inlet and said outlet being in said upper portion, a partition dividing said housing into said upper portion having an upper wall and said lower portion for establishing a direction of flow in a coolant passage from said inlet to said outlet in said upper portion between said partition and said upper wall, a refrigerant disposed in said lower portion of said housing for liquid-to-vapor transformation, said housing being hermetically sealed about said partition to separate said refrigerant in said lower portion from the liquid coolant in said upper portion, flow interrupters disposed in said coolant passage for interrupting thermal boundary layer to enhance thermal heat transfer to the flow of liquid coolant through said coolant passage of said upper portion in response to heat transferred by an electronic device to said lower portion of said housing, and a projection into said coolant passage defining said flow interrupters;

wherein said partition is undulated transversely to said direction of flow from said inlet to said outlet, and wherein said undulated partition comprise V-shaped crests and said flow interrupters extend from V-shaped crests.

2. An assembly as set forth in claim 1 including heat transfer fins disposed in said lower portion of said housing for transferring heat from an electronic device disposed on the exterior of said lower portion of said housing.

3. An assembly as set forth in claim 2 wherein said fins vary in height.

4. An assembly as set forth in claim 3 wherein said fins are of the greatest height midway between said inlet and said outlet and are of progressively lesser height toward said inlet and said outlet respectively.

5. An assembly as set forth in claim 1 wherein said upper portion of said housing is generally rectangular and said lower portion of said housing is generally coextensive with said upper portion.

6. A fluid heat exchanger assembly for cooling an electronic device with a liquid coolant supplied from a heat extractor (R, F) and comprising;

a housing having an inlet and an outlet and an upper portion and a lower portion with said inlet and said outlet being in said upper portion, a partition dividing said housing into said upper portion having an upper wall and said lower portion for establishing a direction of flow in a coolant passage from said inlet to said outlet in said upper portion between said partition and said upper wall, a refrigerant disposed in said lower portion of said housing for liquid-to-vapor transformation, said housing being hermetically sealed about said partition to separate said refrigerant in said lower portion from the liquid coolant in said upper portion, flow interrupters disposed in said coolant passage for interrupting thermal boundary layer to enhance thermal heat transfer to the flow of liquid coolant through said coolant passage of said upper portion in response to heat transferred by an electronic device to said lower portion of said housing, and a projection into said coolant passage defining said flow interrupters;

wherein said partition is undulated transversely to said direction of flow from said inlet to said outlet, wherein said partition defines a bottom of said coolant passage in said upper portion and said upper wall defines the top of said coolant passage, said upper wall also being undulated transversely to said direction of flow from said inlet to said outlet, and wherein said undulated partition and said undulated upper wall define V-shaped crests and said flow interrupters extend from said V-shaped crests.

7. An assembly as set forth in claim 6 wherein said V-shaped crests defining said top and said bottom of said coolant passage are vertically offset so that said coolant passage has a variable cross sectional area therealong.

* * * * *